United States Patent [19]

Hwang et al.

[11] Patent Number: 5,155,380
[45] Date of Patent: Oct. 13, 1992

[54] CLOCK SWITCHING CIRCUIT AND METHOD FOR PREVENTING GLITCH DURING SWITCHING

[75] Inventors: Ching-Tung Hwang; Hsiang-Hsing Sung, both of Taoyuan, Taiwan

[73] Assignee: Acer Incorporated, Taiwan

[21] Appl. No.: 684,587

[22] Filed: Apr. 12, 1991

[51] Int. Cl.⁵ .................. H03K 5/13; H03K 19/02
[52] U.S. Cl. .................... 307/269; 307/265; 307/480; 328/58; 328/63
[58] Field of Search ........ 307/265, 269, 465, 480-481; 328/58, 63

[56] References Cited

U.S. PATENT DOCUMENTS 4,970,418 11/1990 Masterson ..................... 307/269

Primary Examiner—Stanley D. Miller
Assistant Examiner—Margaret R. Wambach
Attorney, Agent, or Firm—Greg T. Sueoka

[57] ABSTRACT

A clock switching circuit comprises a multiplexer, a gate, a first detector, a second detector and a state machine. The multiplexer receives two clock signals and outputs one of them through the gate. The first detector is coupled to the output of the multiplexer and the second detector is coupled to the output of the gate. The state machine controls the output of the gate and the multiplexer in response to signals from the first and second detector, and prevent glitches from being output by the gate.

7 Claims, 4 Drawing Sheets

5,155,380

CLOCK SWITCHING CIRCUIT AND METHOD FOR PREVENTING GLITCH DURING SWITCHING

BACKGROUND OF THE INVENTION

1. Field of the Invention

The present invention relates to circuits for switching between clock signals during the execution of programs in a computer system. In particular, the present invention relates to a circuit for switching between two clock signals of different frequencies without generating a glitch signal, and thus, preventing timing errors in the central processing unit (CPU) or other components.

2. Description of Related Art

A computer system includes many complex digital circuits whose operation is controlled by a clock signal of a certain frequency. The clock signal is usually generated by a crystal oscillator. For example, the microprocessor in most computer systems is driven by an external clock signal to facilitate timing and synchronization of the internal operations. The frequency of the clock signal generally indicates the processing speed of the computer system. The higher the frequency of the clock signal, the faster the execution speed and the greater the power consumption.

Present-day computer systems often provide multiple clock signals with different frequencies. For example, in personal computer systems, clock signal frequencies such as 8 MHz, 12 MHz, 16 MHz, 20 MHz, 25 MHz, 30 MHz, 33 MHz, among others are conventional. While executing programs on a computer system, it is often necessary to switch the system clock signal from one frequency to another for selecting the optimum clock speed for a particular program. For example, a user may execute a graphic drafting program, but the execution speed of the program is too slow at the existing rate of the clock signal. The clock signal should be switched from the existing low frequency (e.g., 12 MHz) to a higher frequency (e.g., 20 MHz) to increase the program's execution speed. Similarly, it may be desirable to change the clock rate from a higher speed to a slower speed. When operating at a high frequency in a computer video game program, the user may be unable to react to the speed of the game. The clock signal should be switched to a lower frequency to provide more time for the user to respond when playing with the game.

As shown in FIG. 1A, a conventional switching circuit 10 such as a multiplexer (MUX) receives a first and second clock signals (CLK1, CLK2) on leads 12 and 14, and a control signal on lead 16. The conventional switching circuit 10 outputs a clock signal (CLKOUT) on signal line 18. The control signal 16 can be generated by hardware or software according to the needs of the system designer. In FIG. 1B, a timing diagram of the wave forms for the control signal, CLK1 signal, CLK2 signal and CLKOUT signal shows the relationship between these signals. Multiplexer 10 outputs the CLK1 signal as the CLKOUT signal if the control signal 16 is high and outputs the CLK2 signal if the control signal 16 is low. The control signal 16 is initially high for outputting the CLK1 signal 12. When control signal 16 falls to a low potential, the CLK2 signal 14 is output on line 18. However, there is a short pulse or glitch 19 during the transition between the CLK1 signal and the CLK2 signal on the CLKOUT signal on line 18.

Generally, a glitch signal causes errors during execution of the processor and other components. Generally, designers assume that glitch signals will not occur when the system clock signal is changed between different frequencies. If a glitch signal appears in the CLKOUT signal, the processor and other components are often unable to complete their operations within the very short pulse width of the glitch, thus the timing of the entire computer system changes and produces unpredictable results.

Therefore, there is a need for a switching circuit for clock signals that does not produce a glitch signal.

SUMMARY OF THE INVENTION

The present invention overcomes the deficiencies of the prior art by providing a switching circuit for clock signals that eliminates glitches during switching. The switching circuit of the present invention comprises a multiplexer, a gate, a first detector, a second detector and a state machine. The multiplexer receives the first clock signal (CLK1) and the second clock signal (CLK2) as inputs. The output of the multiplexer is coupled through the gate to provide the system clock signal (CLKOUT). The output of the multiplexer is also coupled to the first detector, and the second detector is coupled to the output of the gate. The state machine controls the output of the gate which provides the CLKOUT signal, and the multiplexer using outputs of the first and second detectors. By controlling the output of the gate, the occurrence of glitches on the CLKOUT signal is prevented when the multiplexer switches between outputting the CLK1 signal and CLK2 signal.

DETAILED DESCRIPTION OF A PREFERRED EMBODIMENT

Figure 1A:
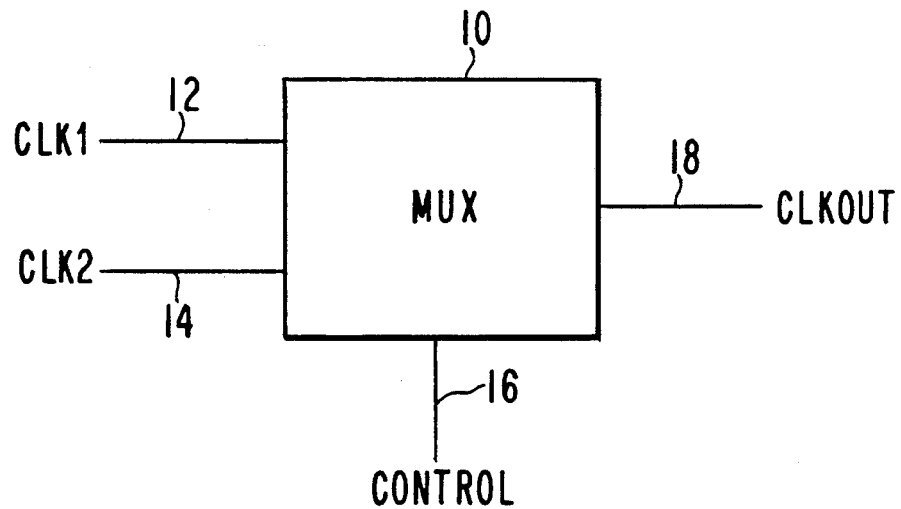
FIG. 1A illustrates a prior art clock switching circuit.
Figure 1B:
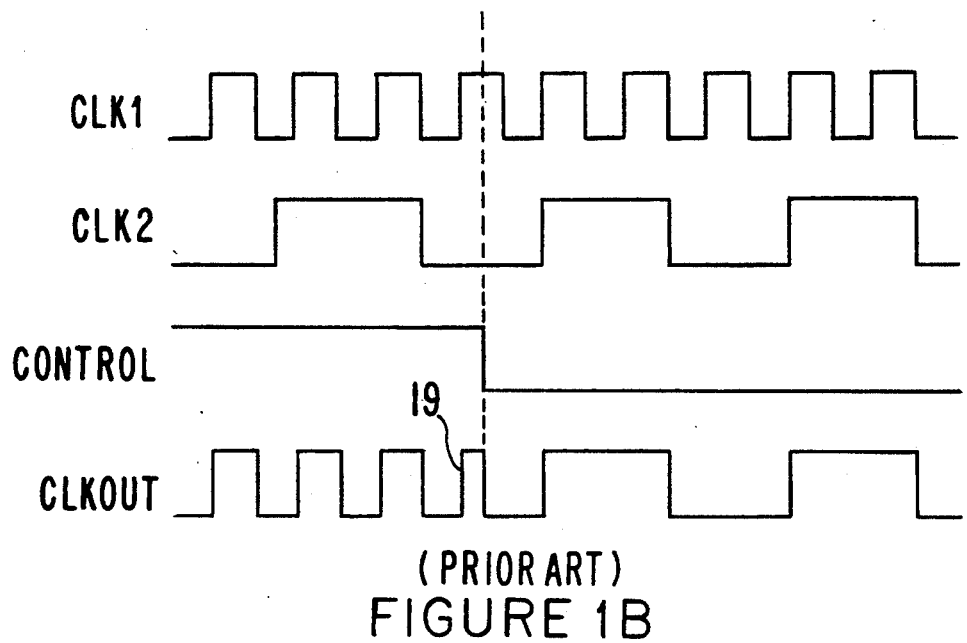
FIG. 1B is a timing diagram of the signals to and from the prior art clock switching circuit.
Figure 2:
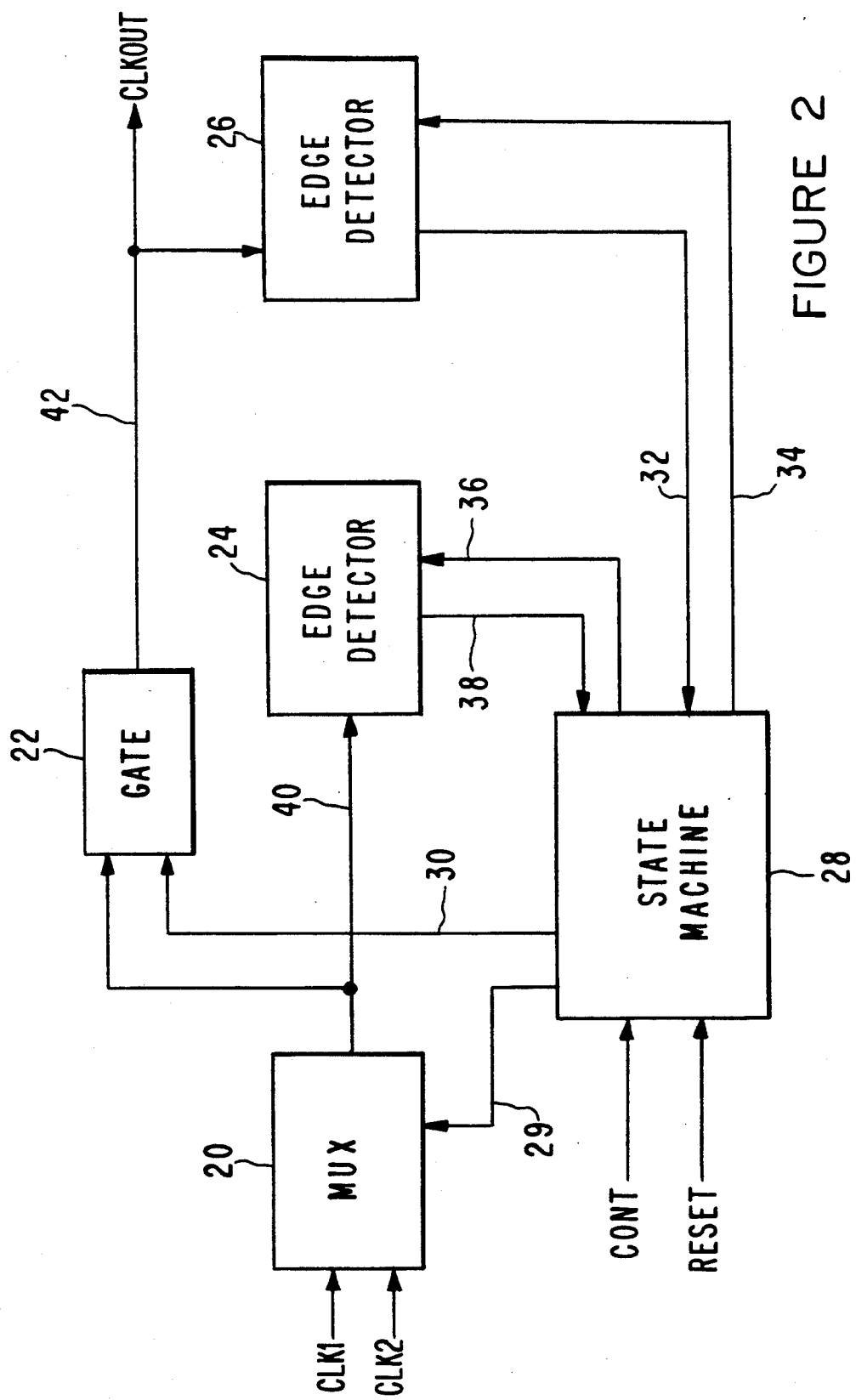
FIG. 2 is a block diagram of a preferred embodiment of the clock switching circuit of the present invention.

Referring now to FIG. 2, a functional block diagram of the preferred embodiment of the present invention is shown. The present invention preferably comprises a multiplexer 20, a gate 22, a first edge detector 24, a second edge detector 26 and a state machine 28. The present invention directs the output of the multiplexer through gate 22. Gate 22 is controlled by state machine 28 based on the outputs of detectors 24 and 26 to remove any glitches on the output of multiplexer 20 caused by switching between different clock frequencies.

Multiplexer 20 receives the first clock signal (CLK1) and the second clock signal (CLK2) as inputs. Multiplexer 20 also receives from and is controlled by the multiplexing selection signal from state machine 28. State machine 28 is coupled to multiplexer 20 by line 29 to send the multiplexing selection signal. In response to the selection signal on line 29, multiplexer 20 outputs either the CLK1 signal or the CLK2 signal. The output on line 40 of multiplexer 20 is coupled to gate 22 and detector 24. Gate 22 then outputs a CLKOUT signal on a line 42. Gate 22 is also coupled to state machine 28 by line 30. Line 30 provides a gate-control signal from state machine 28 to gate 22. The gate-control signal controls the CLKOUT signal output by gate 22.

The switching circuit of the present invention also includes first and second edge detectors 24 and 26. The first edge detector 24 is coupled to multiplexer 20 by line 40 to receive the output of multiplexer 20. The first detector 24 outputs a strobe signal on line 38 if a pulse edged is detected. Detector 24 receives a clear or reset signal from state machine 28 on line 36 to enable the strobe signal 38. The second edge detector 26 is coupled the output of gate 22 by line 42 for receiving the CLKOUT signal. When a pulse edge occurs on the CLKOUT signal, the second detector 26 outputs a strobe signal 32 to state machine 28. Detector 26 receives a clear or reset signal 34 from state machine 28 to disable operation of the strobe output signal 32.

The state machine 28 is the main control component of the present invention. State machine 28 receives a control signal (CONT) and a reset signal (RESET). The hardware or software sends a CONT signal to the switching circuit to change between the CLK1 and CLK2 signal. A change of state in the CONT signal, such as a falling edge from a high potential to low potential or rising edge from low potential to high potential causes multiplexer 20 to switch between the two clock signal inputs. The RESET signal is generated during a cold or hot start of the computer system. The RESET signal initializes some memory components (such as the regenerative devices) in the system. The RESET signal also initializes state machine 28 and its use is limited to start-up of the computer system. In addition to the above-mentioned CONT signal and RESET signal, state machine 28 receives the input strobe signal 38 from detector 24, and strobe signal 32 from detector 26. In accordance with the different signal states input, state machine 28 outputs multiplexing selected signal 29, gate control signal 30, and enable signals 34 and 36.

The operation of state machine 28 is described below. First, it is assumed that the various existing signals such as the multiplexing selection signal 29 and gate control signal 30, cause the CLK1 signal to be output from gate 22. When the CONT signal changes state, state machine 28 activates enabling signal 34 to start edge detector 26. After the next rising or falling pulse edge output from gate 22, edge detector 26 asserts the strobe signal 32. After state machine 28 receives strobe signal 32, state machine 28 asserts gate control signal 30. The assertion of the gate control signal 30 forces the CLKOUT signal in either a logical state "1" or state "0." At the same time, state machine 28 asserts the multiplexing selection signal 29 to change the output 40 of multiplexer 20 to the CLK2 signal. At this time, the CLKOUT signal (line 42) continues to be forced to state "1" or state "0," thereby removing any glitches that otherwise may appear on the CLKOUT signal during the transition from outputting the CLK1 signal to outputting the CLK2 signal. Later, state machine 28 asserts enabling signal 36 to start the operation of edge detector 24. After the next pulse edge on line 40, edge detector 24 asserts the strobe signal 38. Once state machine 28 detects strobe signal 38, state machine 28 deactivates the gate control signal 30, and the CLK2 signal on line 40 is allowed to pass through gate 22 as the CLKOUT signal on line 42.

With the above-mentioned coordination among components, the CLKOUT signal output by the present invention switches to either the CLK1 signal or the CLK2 signal without producing glitches during the conversion process.

Figure 3:
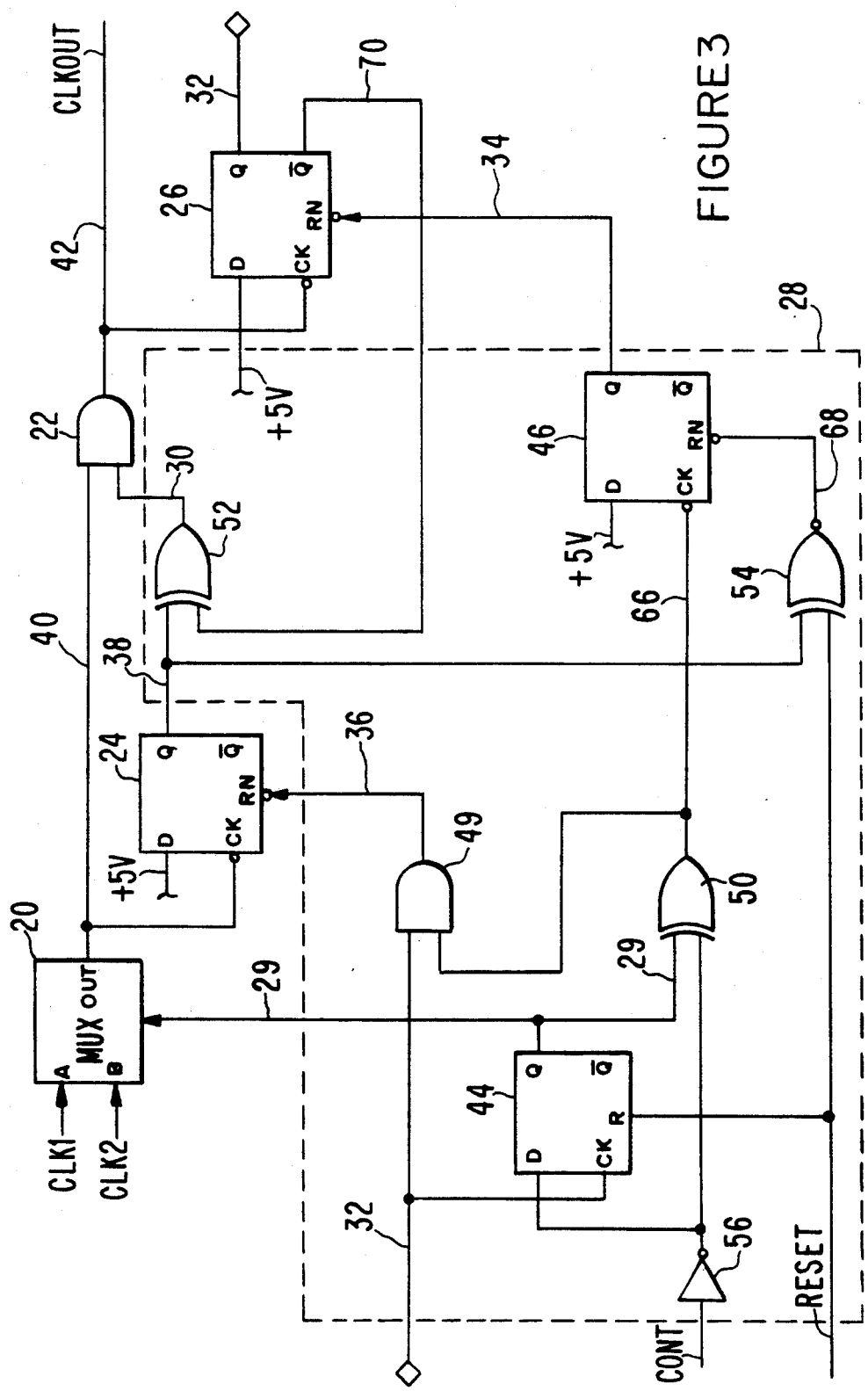
FIG. 3 is a schematic circuit diagram of a preferred embodiment of the clock switching circuit of the present invention.

Referring now to FIG. 3, a schematic diagram of the preferred embodiment of the present invention is shown. As shown in FIG. 3, multiplexer 20 is preferably a two input multiplexer; the first and second edge detectors 24 and 26 are preferably D flip-flops; and gate 22 is preferably an AND gate. While multiplexer 20 only includes two inputs, it should be understood that other multiplexers may be used to provide selection between any number of clock signals with different frequencies. In the preferred embodiment of FIG. 3, the state machine 28 comprises a first latch 44, a second latch 46, an AND gate 49, an EXCLUSIVE-OR gate 50, an OR gate 52, a NOR gate 54. The latches 44 and 46 may also be D flip-flops. The latches 44 and 46 are coupled to the combinational logic 49, 50, 52 and 54 to provide a state machine 28 with two states.

The clock (CK) input of latch 44 is coupled to the Q output of edge detector 26 and the D input of latch 44 is coupled to the inverted CONT signal output by an inverter 56. The Q output of latch 44 provides the multiplexing selection signal 29 to multiplexer 20 and an input terminal of EXCLUSIVE-OR gate 50. Multiplexing selection signal 29 selects the CLK1 signal or the CLK2 signal to be output by multiplexer 20. The output 40 of multiplexer 20 is coupled to an input of gate 22 and the clock (CK) input of detector 24.

The other input of EXCLUSIVE-OR gate 50 is coupled to the output of inverter 56 to receive the inverted CONT signal. The output 66 of EXCLUSIVE-OR gate 50 is coupled to an input of AND gate 49 and the clock (CK) input of latch 46. The other input of AND gate 49 is provided by the Q output 32 of edge detector 26. The output 36 of AND gate 49 is coupled to the reset input of edge detector 24. The output 36 is low most of the time except for a short period after a transition in the CONT signal. Thus, the output 32 of edge detector 26 is disabled (held at low potential) most of the time since the reset input is held low.

The Q output of edge detector 24 provides the strobe signal 38 sent to state machine 28. The Q output 38 of edge detector 24 is coupled to an input of OR gate 52, and an input of NOR gate 54. The other input of OR gate 52 is coupled to the Q' output of edge detector 26. The gate control signal 30 provided by OR gate 52 has its output coupled to an input of AND gate 22. The gate control signal 30 controls the output of gate 22. The CLKOUT signal from the output of gate 22 is forced low whenever the gate control signal is low. On the other hand, if the gate control signal is at a high logic level, the output 40 of multiplexer 20 passes through gate 22 as the CLKOUT signal 42.

As noted above, one input of NOR gate 54 is strobe signal 38. The other input of the NOR gate 54 is coupled to the RESET signal. The output of NOR gate 54 is coupled with the reset input of latch 46. The Q output of latch 46 outputs an enable signal 34, and is coupled to the reset input of edge detector 26. The Q output of the second latch 46 remains low except during a time period after a transition in the CONT signal, thus, the second detector 26 is disabled (i.e., output forced to a low potential) except after a transition in the CONT signal. The D inputs of edge detectors 24 and 26, as well as latch 46, are preferably coupled to a +5 voltage level which represents a logical high or "1." Therefore, when not being reset and a clock pulse is received on the clock input, the flip-flops 24, 26 and 46 make a transition from a low potential to a high potential. They will return to outputting a low potential when the reset signals 34, 36, 68 return to a low potential.

Figure 4:
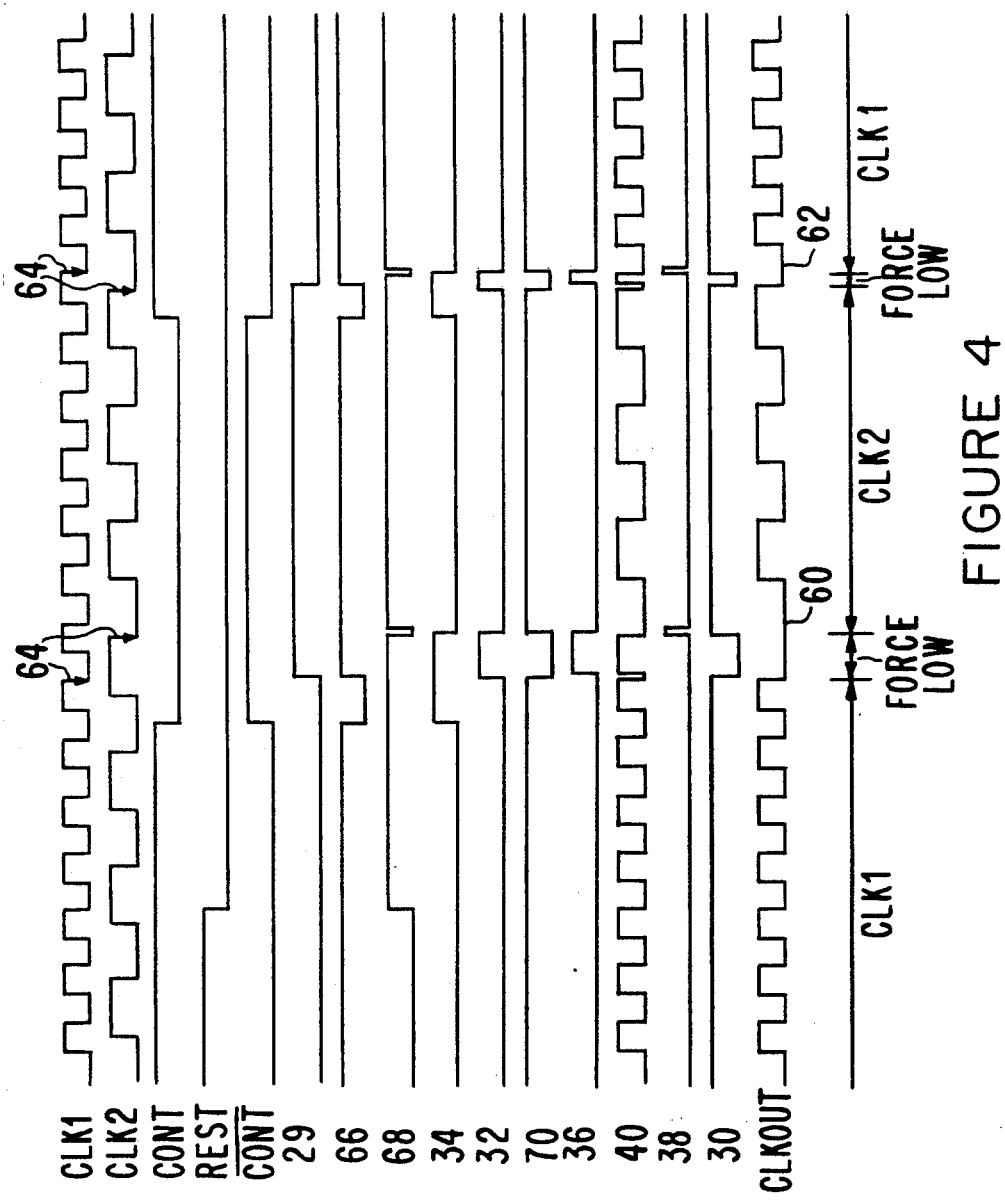
FIG. 4 is a timing diagram for the preferred embodiment of the switching circuit of the present invention shown in FIG. 3.

FIG. 4 illustrates a timing diagram for CLK1, CLK2, CONT, RESET, CLKOUT signals. FIG. 4 also illustrates timing diagrams of key signals of state machine 28, and signals between edge detectors 24, 26 and state machine 28. As best shown by the timing diagram for the CLKOUT signal, the state machine 28 forces the CLKOUT signal to a low logic level during the transition between the CLK1 signal and the CLK2 signal. In FIG. 4, the CLKOUT waveform shows the transition where the output of the present invention switches from the CLK1 signal to CLK2 signal. There is a period 60 during which the CLKOUT signal is forced to a low potential for a longer duration. Similarly, when the output of the present invention switches from the CLK2 signal to the CLK1 signal, the CLKOUT signal is again held at a low potential for a time period 62 during which the transition between clock signals occurs.

The embodiment shown in FIG. 3 enables (reset inputs receive a high potential) the first and second edge detectors 24 and 26 to generate strobe signals 38 and 32, respectively, on the falling edges 64 of the CLK1 and CLK2 signals. However, it should be understood that those skilled in the art may modify the circuit of FIG. 3 so that edge detectors 24 and 26 produce strobe signals 38 and 32 on the rising edges of the CLK1 and CLK2 signal and the CLKOUT signal may be forced to a high potential or logical "1" level. Thus, by forcing the CLKOUT signal to either a high or low potential the present invention prevents any spurious pulses or glitches from appearing in the CLKOUT signal.

What is claimed is:

1. A device for switching between a first and a second clock signal, said device comprising:
    a multiplexer having a first input coupled to the first clock signal; a second input coupled to the second clock signal; a control input and an output; said multiplexer receiving two signals and outputting one of two input signals;
    a gate having a first and second inputs and an output for passing the signal on the first input to the output of said gate in response to the signal on the second input of said gate;
    a first detector having a control input, a data input and an output, the data input of said first detector coupled to the output of the multiplexer; said first detector detecting a rising or falling edge of the signal on the data input;
    a second detector having a control input, a data input and an output for detecting a rising or falling edge of the signal on the data input, the data input of said second detector coupled to the output of the gate; and
    a state machine having a plurality of inputs and outputs for controlling the multiplexer, the gate, the first detector and the second detector to prevent spurious pulses on the output of the gate, said state machine receiving a reset signal on a first input, a CONT signal on a second input, and having outputs coupled to the control input of the multiplexer, the second input of the gate, the control input of the first detector, and the control input of the second detector.

2. A device for switching between a first and a second clock signal, said device comprising:
    a multiplexer having a first input coupled to receive the first clock signal, a second input coupled to receive the second clock signal, a control input and an output, said multiplexer receiving two signals and outputting one of two input signals;
    an AND gate having a first and second inputs and an output for passing the signal on the first input to the output of said AND gate in response to the signal on the second input of said AND gate;
    a first detector having a control input, a data input and an output, the data input of said first detector coupled to the output of the multiplexer, said first detector detecting a rising of falling edge of the signal on the data input;
    a second detector having a control input, a data input and an output for detecting a rising or falling edge of the signal on the data input, the data input of said second detector coupled to the output of the AND gate; and
    a state machine having a plurality of inputs and outputs for controlling the multiplexer, the gate, the first detector and the second detector to prevent spurious pulses on the output of the AND gate, said state machine receiving a reset signal on a first input, a CONT signal on a second input, and having outputs coupled to the control input of the multiplexer, the second input of the AND gate, the input of the first detector, and the control input of the second detector.

3. The device of claim 2, wherein the first edge detector is a D-Flip-Flop.

4. The device of claim 2, wherein the second edge detector is a D-Flip-Flop.

5. The device of claim 2, wherein the multiplexer is a two input, one output multiplexer.

6. The device of claim 2, wherein the state machine further comprises a first D-Flip-Flop; a second D-Flip-Flop; and combinational logic.

7. A method of removing spurious pulses from an output of a clock switching circuit, said clock switching circuit having a multiplexer with inputs for receiving a first and a second clock signals and an output for sending one of the clock signals received, said method comprising:
    monitoring a control signal sent to the clock switching circuit for a transition in state; monitoring the output of the clock switching circuit for a first falling transition between a high state and a low state after the transition in state of the control signal is sensed;
    inhibiting any transitions on the output of the clock switching circuit after the first falling transition of the output of the clock switching circuit;
    switching the output of the multiplexer between the first and second clock signals received; and
    allowing transitions on the output of the clock switching circuit after a first falling edge on the output of the multiplexer is sensed.

* * * * *